(12) United States Patent
Lin

(10) Patent No.: US 6,388,292 B1
(45) Date of Patent: *May 14, 2002

(54) DISTRIBUTED MOSFET STRUCTURE WITH ENCLOSED GATE FOR IMPROVED TRANSISTOR SIZE/LAYOUT AREA RATIO AND UNIFORM ESD TRIGGERING

(75) Inventor: Shi-Tron Lin, Taipei (TW)

(73) Assignee: Winbond Electronics Corporation (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/460,357

(22) Filed: Dec. 13, 1999

Related U.S. Application Data

(63) Continuation of application No. 08/931,594, filed on Sep. 16, 1997, now Pat. No. 6,002,156.

(51) Int. Cl.[7] .......................... H01L 23/62; H01L 29/76
(52) U.S. Cl. ..................... 257/356; 257/357; 257/360; 257/401; 438/284; 438/286
(58) Field of Search .................... 257/356, 357, 257/360, 401; 438/284, 286

(56) References Cited

U.S. PATENT DOCUMENTS

| | | | |
|---|---|---|---|
| 5,355,008 A | 10/1994 | Moyer et al. | 257/341 |
| 5,635,742 A | 6/1997 | Hoshi et al. | 257/337 |
| 5,757,046 A | 5/1998 | Fujihira et al. | 257/339 |
| 5,852,315 A | 12/1998 | Ker et al. | 257/355 |
| 5,955,763 A | * 9/1999 | Lin | 257/355 |
| 6,002,156 A | * 12/1999 | Lin | 257/356 |

* cited by examiner

Primary Examiner—Tom Thomas
Assistant Examiner—Donghee Kang
(74) Attorney, Agent, or Firm—Proskauer Rose, LLP

(57) ABSTRACT

A MOSFET structure uses angled poly-gate segments positioned between drain and source diffusion regions such that the entire continuous gate element structure is within the active region in a substrate. The gate-to-source diffusion edges are continuous along the gate body, so as to cascade the snap-back action to enhance uniform turn on of the entire gate element during an ESD event. The angled gate segments provide a total gate-to-area ratio greater than that of a multi-finger-gate configuration within an equal size active region. In addition, the gate signal RC delay is sufficient to provide noise suppression of the output voltage when the MOSFET is used as a high current-drive CMOS output buffer.

27 Claims, 5 Drawing Sheets

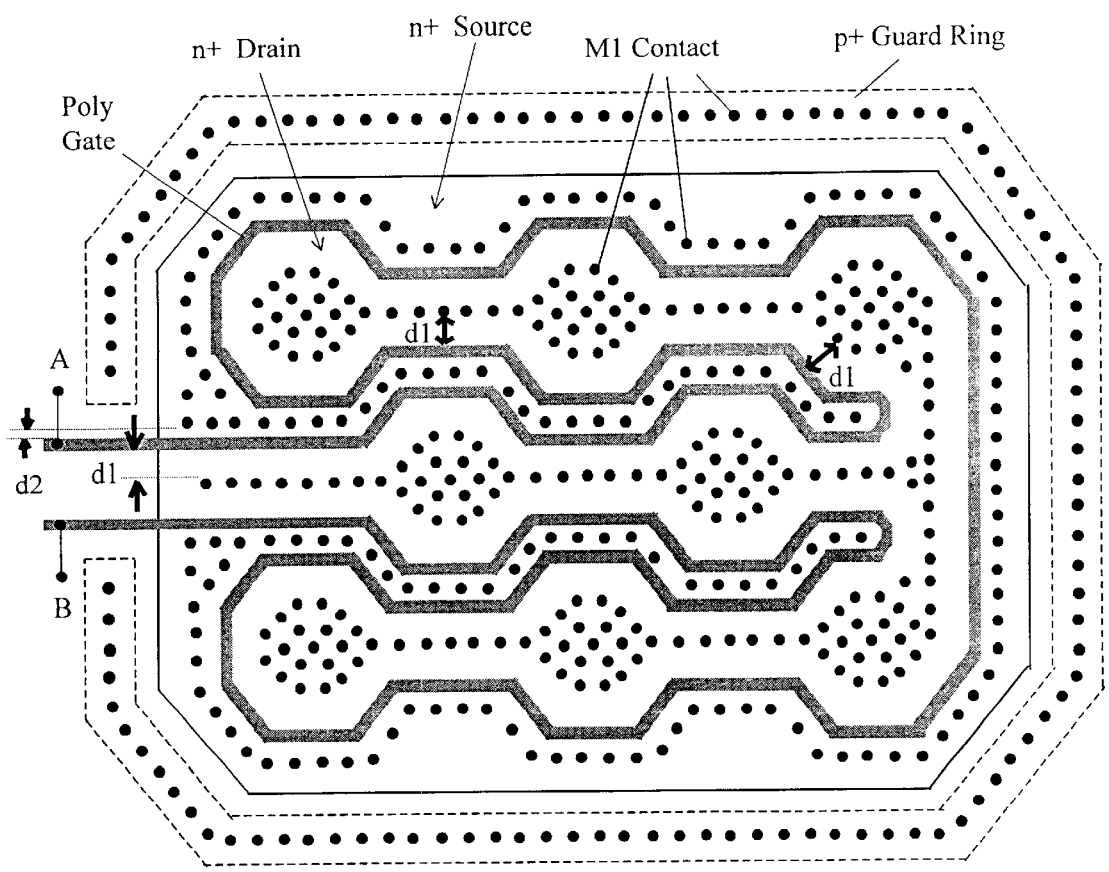
(Fig. 10)

DISTRIBUTED MOSFET STRUCTURE WITH ENCLOSED GATE FOR IMPROVED TRANSISTOR SIZE/LAYOUT AREA RATIO AND UNIFORM ESD TRIGGERING

RELATED APPLICATION

This application is a Continuation-In-Part of U.S. patent application Ser. No. 08/931,594, filed Sep. 16, 1997, U.S. Pat. No. 6,002,156.

This invention is related to U.S. Pat. No. 5,955,763, entitled "A Low Noise, High Current-Drive MOSFET Structure for Uniform Poly-Gate Turn-On During an ESD Event", and U.S. patent application Ser. No. 08/931,342, entitled "A High-Speed MOSFET Structure for ESD Protection", filed on even date herewith for Shi-Tron Lin. The contents of the above-noted applications are incorporated herein by reference.

FIELD OF THE INVENTION

The present invention relates to a MOSFET structure for use in ESD applications. More specifically, the present invention relates to a distributed MOSFET structure which increases the gate-to-area ratio while improving the ESD triggering uniformity.

BACKGROUND OF THE INVENTION

An NMOSFET is a very effective ESD protection device. In one application, it is used as the pull down transistor of a CMOS buffer to drive an output voltage for an external device. In this type of application, the gate of the NMOSFET is connected to an input drive signal.

In another common NMOSFET application, the gate is electrically connected to ground, and the NMOSFET is used as an ESD protection device for an input pin or a power bus during an ESD event.

The ESD protective action of an NMOSFET is based on the device's snap-back mechanism, which enables the NMOSFET to conduct a high level of ESD current between its drain and source. This occurs when a strong electric field across the depletion region in the drain substrate junction becomes high enough to begin avalanche breakdown, which in turn causes impact ionization, resulting in the generation of both minority and majority carriers. The minority carriers flow toward the drain contact, and the majority carriers flow toward the substrate/p-well contact, causing a local potential build up across the current path in the p-well substrate. When the local substrate potential is 0.6V higher than an adjacent n+ source potential, the source junction becomes forward biased. The forward biased source junction then injects minority carriers (electrons) into the p-well, and these carriers eventually reach the drain junction to further enhance the impact ionization effect (see "ESD in Silicon Integrated Circuits", by A. Amerasekera and C. Duvvury, Chap. 3, Sec. 1., John Wley & Sons, 1995). Eventually, the NMOSFET reaches a low impedance (snap-back) state, which enables it to conduct a large amount of ESD current.

To enhance the ESD protection capabilities of a MOSFET device, it is desirable to have a rapid turn on with a high degree of uniformity throughout the device. A known technique for accomplishing this objective utilizes a multi-gate-finger configuration to increase the gate effectiveness. However, in a typical multi-gate-finger NMOS structure, as shown in FIGS. 2a and 2b, not all the poly gate fingers may turn on during an ESD event. That is, when the first few gate fingers reach their snap-back low impedance mode, the drain terminal to source terminal voltage is reduced to a value, called the snap-back voltage, which is less than the trigger voltage of the NMOS device. This has the effect of preventing the remaining gate fingers from being turned on. As a result, only a partial number of the gate fingers are available to absorb the ESD energy. Therefore, the ESD protection provided by the NMOSFET is significantly reduced.

When a MOSFET gate finger is triggered during an ESD event, the entire finger turns on. This is due to the cascading effect of the previously described impact ionization and snap-back process along the entire gate finger. Moreover, experimental data indicates that a long-gate-finger structure (e.g. 100 um×2), as shown in FIG. 3, has better ESD performance than a short-gate-finger structure (e.g. 20 um×10), of the type shown in FIG. 2a, where both structures have the same total gate width of 200 um. That is, during an ESD event, the long-finger NMOSFET structure will have either one or two gate fingers (50% to 100% of total gate width) turned on, while the short-finger NMOSFET may only have a few fingers (out of 10) turned on, with each finger being only 10% of the total gate width, thus reducing the short-finger MOSFET's ability to absorb ESD current as compared to the long finger configuration. For manufacturing purposes, however, layout area is typically at a premium, and a conventional long-finger structure may not fit in the designated layout area. Therefore, both multi-gate-finger (short) and long-gate-finger (long) types of structures are used, depending on physical and electrical priorities.

A commonly used multi-gate-finger structure is shown in FIG. 4, where the poly-gate fingers are connected by a poly-gate bus, rather than the metal bus of FIG. 2a.

One prior art technique for improving the uniform turn on of such a multi-gate-finger NMOSFET structure uses a gate coupled technique, as shown in FIG. 5, and as described in "ESD in Silicon Integrated Circuits", by A. Amerasekera and C. Duvvury, Chap. 4, Sec. 2., John Wiley & Sons, 1995. In this configuration, the drain is connected to either VDD or the buffer output line, and the gate is coupled to the drain via a capacitor C, and is also connected to ground via a resistor R The coupling capacitor C and the RC time constant of the circuit cause the gate potential to rise to 1 to 2v during the first 5 to 10 ns of an ESD event. The positive gate voltage reduces the triggering threshold of the NMOSFET, thereby enabling a more uniform turn-on of the gate fingers. This method, however, has the disadvantage of requiring additional layout area for the coupling capacitor C and the resistor R. In addition, since the gate is connected to ground through a resistor R, this configuration is not particularly well suited for an output buffer application.

Another type of prior art multi-gate-finger structure, as described in U.S. Pat. Ser. No. 4,949,139, by Korsh et al, uses the gate resistance in combination with the MOSFET RC delay to sequentially cause the MOSFET gate fingers to be turned on or off. This sequential turn on/turn off technique suppresses the noise spikes in a high current-drive output buffer through time distribution. FIG. 6 shows this type of prior art configuration, where the poly-gate fingers are serially connected into a serpentine-like gate structure in order to increase the gate signal RC delay.

With respect to ESD uniform turn on, however, this prior art serpentine gate structure is essentially equivalent to a conventional multi-gate-finger structure (FIG. 4), since each gate finger extends beyond the diffusion area and into the field oxide region. Therefore, as described above, this configuration does not provide optimum ESD protection because of its non-uniform turn on characteristics, in that only a partial number of gate fingers may turn on during an ESD event.

Other types of prior art multi-gate-finger structures, such as those described in U.S. Pat. No. 4,636,825, by Martin J. Baynes, and U.S. Pat. No. 5,355,008, by Moyer et al., use a waffle or mesh type of configuration. These structures, however, have individually separated source and drain regions arranged in either a checkerboard or diamond pattern, and may not provide a uniform turn on environment for their corresponding gate configurations during an ESD event.

Accordingly, it is an object of the present invention to overcome the disadvantages of the prior art with respect to MOSFET ESD protection. More specifically, it is an object of the present invention to increase the gate-to-layout area ratio, while at the same time providing an improved turn on uniformity during an ESD event.

SUMMARY OF THE INVENTION

In accordance with an illustrative embodiment of the present invention, a continuous, angled, multi-segment poly-gate element is configured within a MOSFET structure to enhance uniform turn on during an ESD event. This is achieved by interpositioning a series of closed polygonal gate loops within the drain and source diffusion regions. Importantly, the gate element and drain and source diffusion regions are completely contained within an active oxide diffusion region, such that the gate-to-source diffusion edges are continuous throughout the length of the gate body, and the drain diffusion regions are completely surrounded by a corresponding poly-gate loop. This enables a cascading snap-back action to develop very rapidly along the entire gate element during the occurrence of an ESD event, thus enhancing the desired uniform turn on of all the MOSFET devices within the diffusion area. In addition, the angled gate segments provide a total gate-to-area ratio greater than that of a multi-finger-gate configuration within an equal size active region.

In another illustrative embodiment of the present invention, a MOSFET structure is configured with a series of open polygonal gate loops interpositioned between corresponding drain and source diffusion regions within an active region. As in the first embodiment, the gate-to-source diffusion edges are continuous throughout the length of the gate body, and the drain diffusion regions are substantially surrounded by a corresponding poly-gate loop. Again, the cascading snap-back action develops very rapidly along the entire gate element during the occurrence of an ESD event, thus enhancing the desired uniform turn on of the MOSFET devices within the diffusion area. Also, as in the first embodiment, the angled gate segments provide a total gate-to-area ratio greater than that of a multi-finger-gate configuration within an equal size active region.

Alternatively, when the MOSFET is used as a high current-drive output buffer, both the closed and open loop gate configurations, in conjunction with their respective gate signal RC delays, provide suppression of the noise signals typically generated by the switching action of the output stage.

These embodiments are more fully described below in conjunction with the following drawings.

BRIEF DESCRIPTION OF THE DRAWING

FIG. 2b is a schematic representation of the structure of FIG. 2a.
FIG. 10 depicts a fifth embodiment of the present invention.

DETAILED DESCRIPTION OF THE PREFERRED EMBODIMENT

In order to achieve a high degree of turn on uniformity during an ESD event, it is advantageous to maintain a continuous gate-to-source diffusion edge, so that the above described snap-back condition cascades throughout the entire gate element. That is, once the adjacent source junction is forward biased, or near forward biased, the drain trigger voltage can be substantially lower than normal, enabling the entire MOSFET structure to trigger uniformly, and to sustain the snap-back condition.

Figure 1:
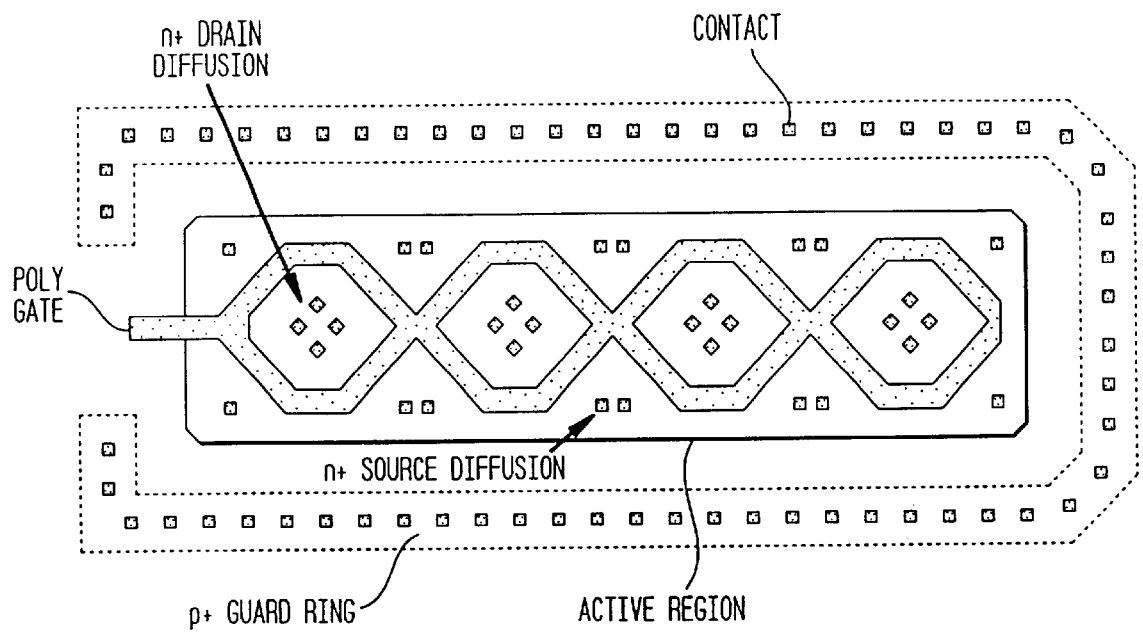
FIG. 1 depicts a first embodiment of the present invention.

A first embodiment of the present invention provides a continuous gate-to-source diffusion edge for uniform turn on during an ESD event. As depicted in FIG. 1, a continuous, multi-loop poly-gate (poly loop) element is positioned within an active source diffusion region, with each gate loop surrounding a drain diffusion island. In addition, the gate body has rounded corners, which are used to prevent an electric field "crowding" effect.

Figure 2A:
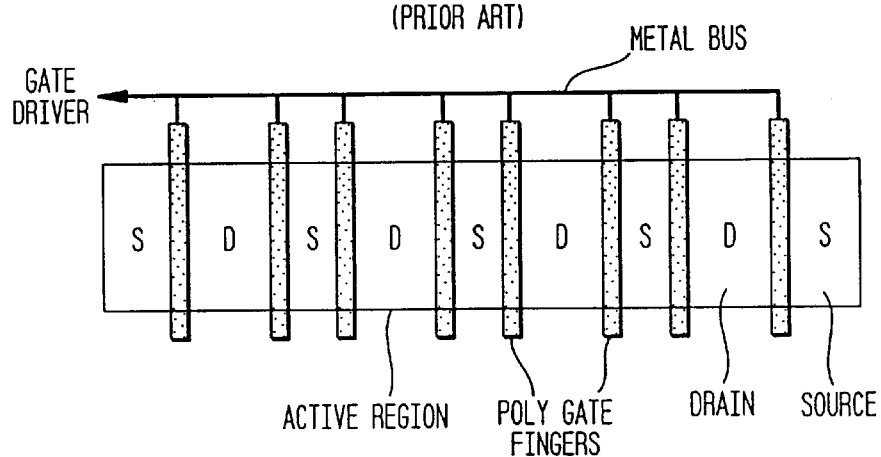
FIG. 2a shows a basic multi-gate-finger NMOS structure.
Figure 2B:
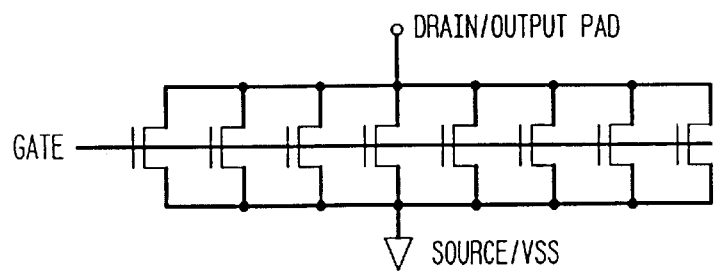
Figure 3:
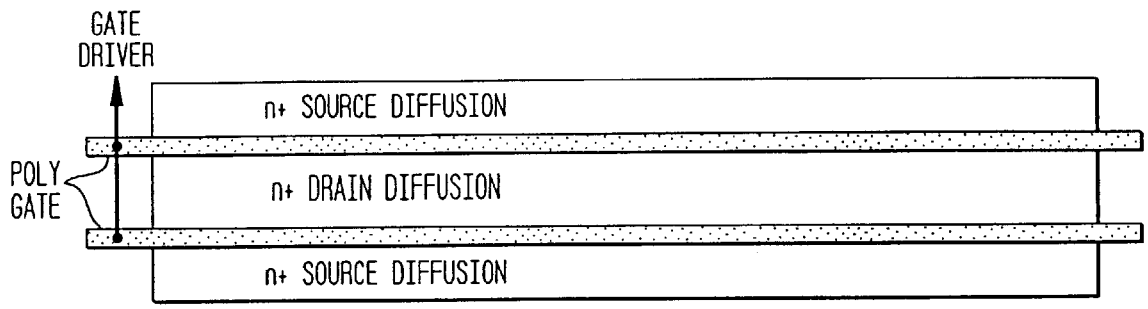
FIG. 3 shows a basic long-gate finger structure.
Figure 4:
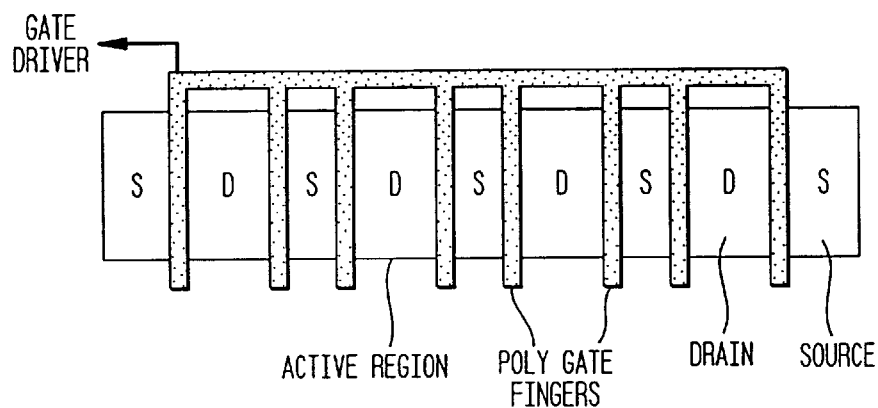
FIG. 4 depicts a conventional multi-gate-finger NMOS structure.
Figure 5:
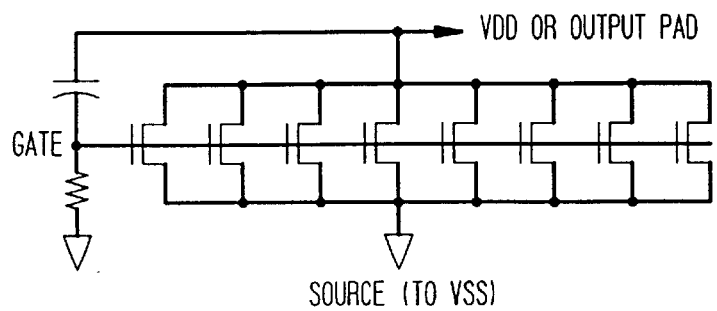
FIG. 5 is a schematic representation of a gate coupled MOSFET.
Figure 6:
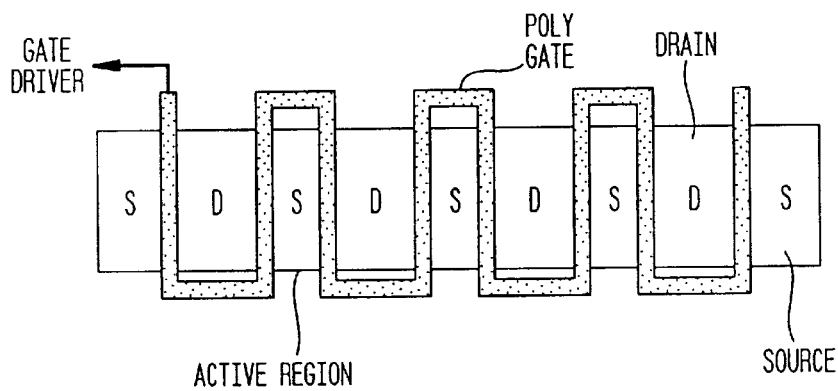
FIG. 6 shows a prior art serpentine gate configuration.

The poly-gate intersections are angled in the range of approximately 30 to 60° (typically near 45°), so that the gate-to-layout area ratio is significantly greater than that of a conventional short or long multi-gate-finger structure (FIGS. 2a, 3 and 5) within the same active region. Illustratively, the inventive gate configuration provides an effective gate size (width) approximately 40% greater than that of a conventional multi-gate-finger structure within an active diffusion region of the same area.

Moreover, the long gate signal RC delay enhances the suppression of overshoot noise on the output voltage of a high current-drive output buffer. Therefore, the inventive MOSFET may be used as the pull-down device of a low-noise, high-current CMOS driver. In this application, the poly-gate would be electrically connected to a gate-drive signal, and the drain would be electrically connected to an output pad.

For an illustrative ESD application of the present invention, the MOSFET would be configured as a normally-off ESD protection device. The gate and source would be electrically connected to ground, while the drain would be electrically connected to an input pin or to the VDD power bus for protection during an ESD event. As described above, the inventive gate configuration (contained entirely within the active region) provides a rapid snap-back cascading effect along the entire gate body, which enhances the uniform turn on of the entire MOSFET structure, so that the full gate width may be available to pass ESD current, thus improving the effectiveness of the MOSFET for ESD protection.

Figure 7:
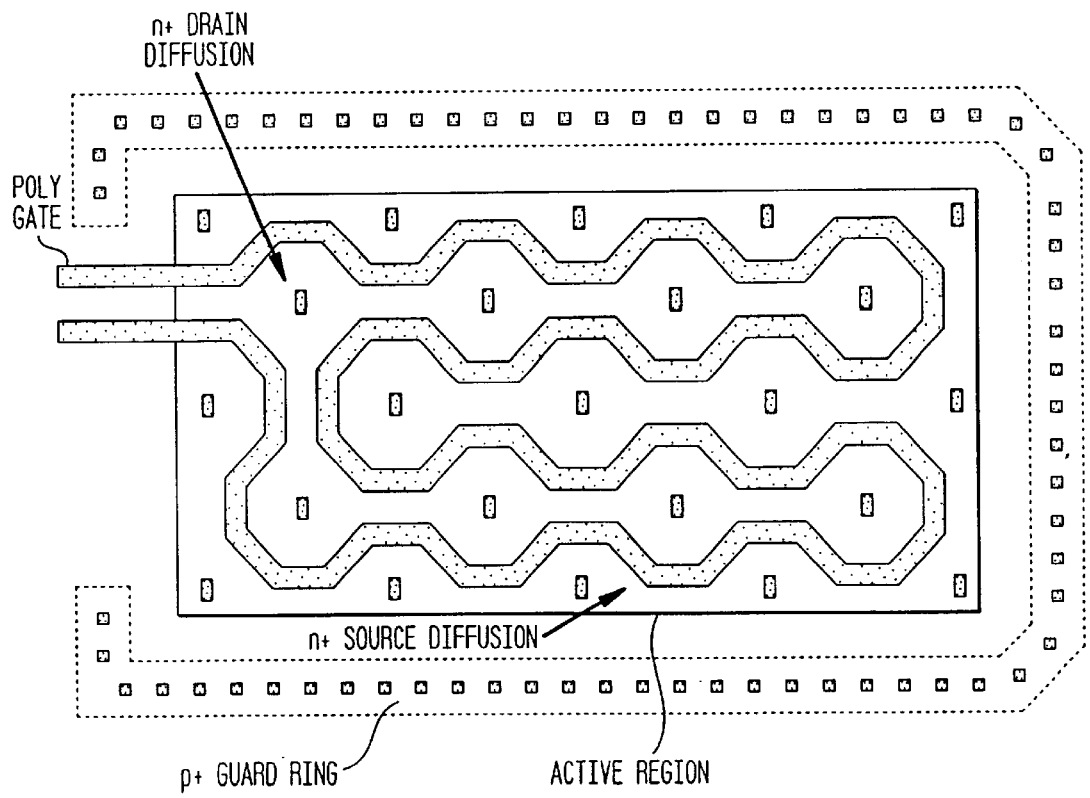
FIG. 7 depicts a second embodiment of the present invention.

A second embodiment of the present invention, as shown in FIG. 7, uses a connected series of nearly enclosed poly gate cells to form continuous gate-to-drain and gate-to-source diffusion edges within an active diffusion region. In similar fashion to the above described first embodiment, the angled gate element provides an increase in gate size for a given active diffusion region, as compared to a conventional multi-gate-finger structure. Moreover, the continuous gate-to-drain and gate-to-source diffusion edges enhance the uniform turn on of the entire MOSFET during an ESD event.

Figure 8:
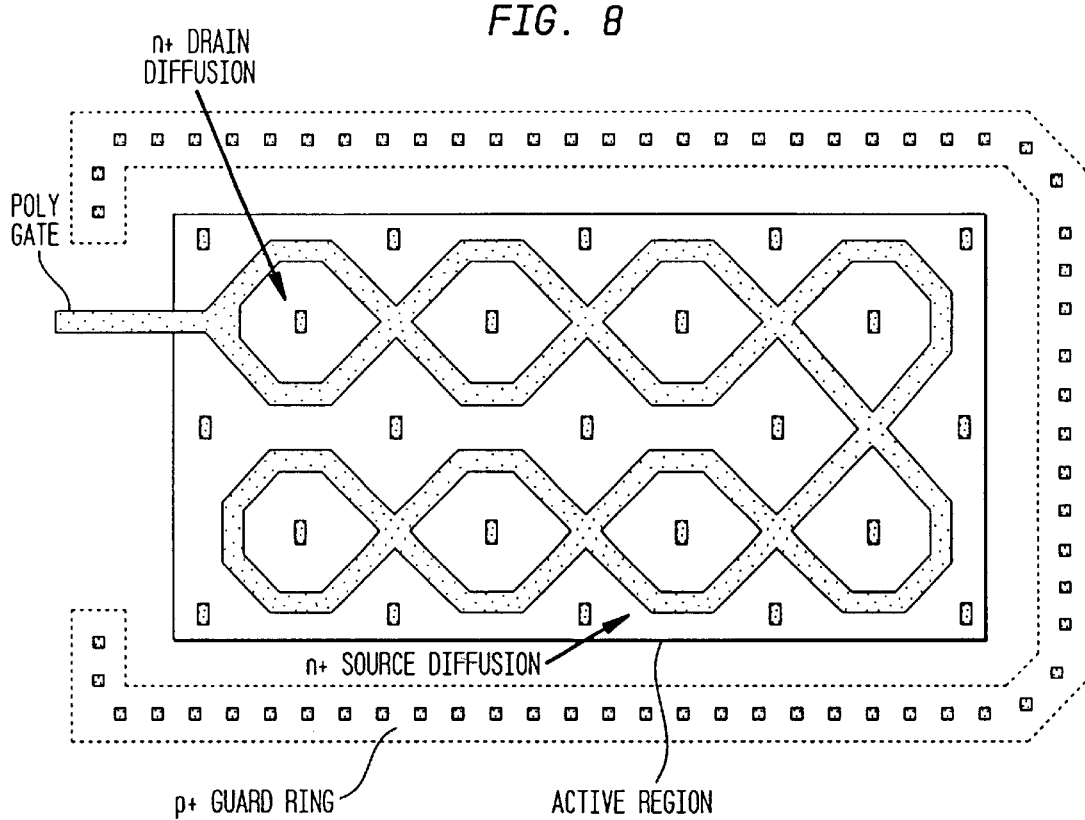
FIG. 8 depicts a third embodiment of the present invention.

A third embodiment of the present invention is shown in FIG. 8. This embodiment combines the features and advantages of the first and second embodiments previously described.

Figure 9:
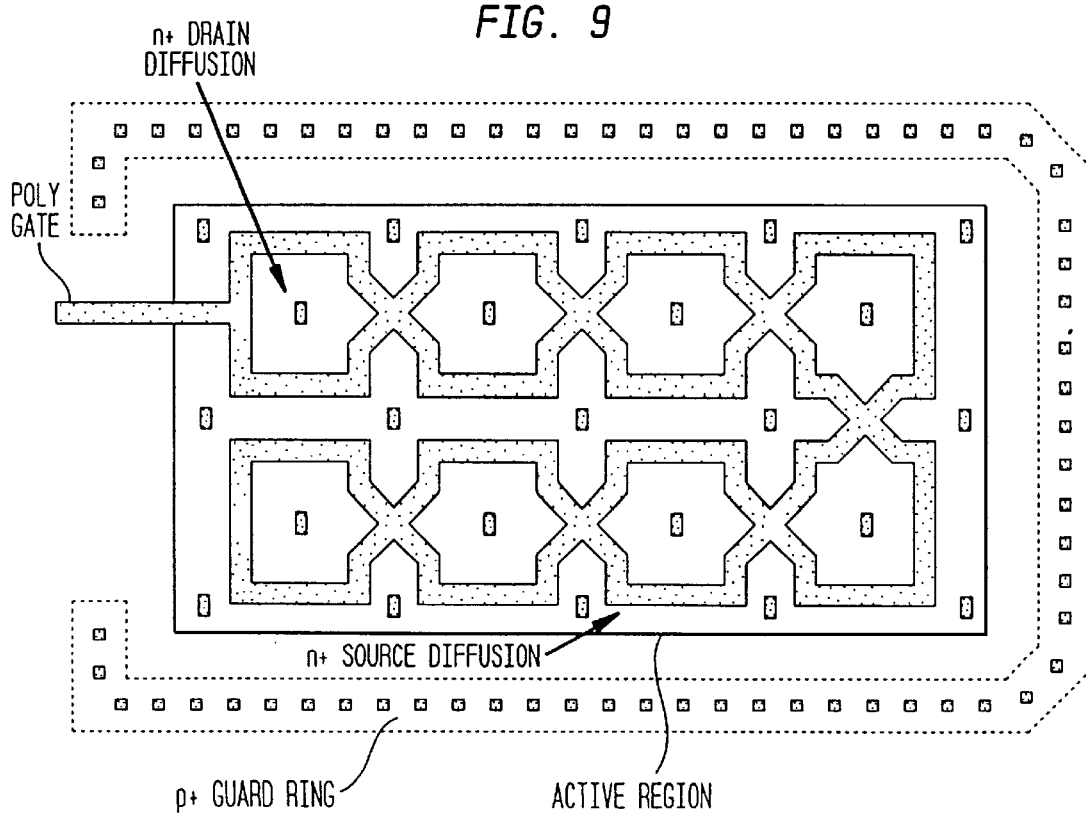
FIG. 9 depicts a fourth embodiment of the present invention.

A fourth embodiment of the present invention is shown in FIG. 9. This embodiment is an enhancement of the third embodiment, in that additional gate segments with rounded corners are integrated into the poly-gate element to further improve turn on uniformity, as well as to increase the total effective gate width.

In short, four exemplary embodiments of an inventive MOSFET structure are disclosed with improved turn on characteristics during an ESD event. In addition, the disclosed structures also provide an increase in effective gate width for a given active region size.

Furthermore, as shown in FIG. 1, multiple contacts within a poly loop help to uniformly distribute the high ESD current during an ESD event. As shown in FIG. 1, the multiple drain contacts in a poly loop are distributed substantially symmetrically around a center of the poly loop. As further shown in FIG. 1, a contact-to-poly spacing inside the poly loop is kept larger than a contact-to-poly spacing outside the poly loop. Accordingly, when inside a poly loop being a drain region and outside a poly loop being a source region, the drain contact-to-poly spacing is kept larger than the source contact-to-poly spacing to improve the robustness of the ESD protection structure. It is also clear that the above described contact placement method can be applied to the open-loop or closed-loop structures of FIGS. 7 to 9.

FIG. 10 shows another embodiment of the present invention. A number of at least one open loop is included in the ESD protection structure. A continuous poly gate having two ends represented by nodes A and B. As described previously, Node A can be either coupled to a power bus (e.g., a VSS or ground bus for NMOSFET, or a VDD bus for PMOSFET) for providing ESD protection to an input-circuit or power-buses, or coupled to a gate-driving node if the ESD protection structure is configured as a self-protective output buffer. As described earlier, Node B can be either floating or connected to node A.

The previously described contact distribution for uniform ESD current distribution during an ESD event is also illustrated in FIG. 10. As is known that for ESD protection devices, the drain contact-to-poly-gate space (d1) is typically kept larger than the source contact-to-poly-gate space (d2). As an example, d1 can be 3 to 8 um, while d2 can be 2 um or less, and larger than or equal to the minimum design rule. Shown in FIG. 10, the plurality of drain contacts can be kept at approximately equal to d1, and the plurality of source contacts can be kept at approximately d2, from the poly gate, with d1>d2 and d2≧minimum design rule.

Alternatively, the oxide below said poly gate can be a field oxide. Still alternatively, the poly above said field oxide can be removed for said ESD protection structure.

Without deviating from the principle of the present invention, it is clear that a plurality of ESD protection structures such as shown in FIGS. 1 and 7–10 can be electrically connected in parallel to increase the ESD protection strength. The parallel connected ESD protection structures can be constructed within the same active region. It is also well known that the doping polarity of an ESD protection device along with the body (a substrate or well) can be totally reversed without deviating from the principle of the invention.

The above described embodiments of the invention are intended to be illustrative only. Numerous alternative embodiments may be devised by those skilled in the art without departing from the spirit and scope of the following claims.

What is claimed is:

1. A MOSFET structure for enhancing uniform poly-gate turn-on during an ESD event, comprising:
   an active region within a substrate,
   a plurality of first doped regions of a first impurity type and at least a second doped region of the first impurity type within said active region, and
   a continuous poly-gate element comprising a plurality of interconnected closed polygonal loops inter-positioned between said plurality of first doped regions and said second doped region, such that a continuous gate-to-second-doped-region edge is formed along an entire outer edge of said poly-gate element, and with said first doped regions being individually surrounded by inner edges of said poly-gate polygonal loops, said poly-gate element being completely disposed within said active region.

2. The MOSFET structure of claim 1, further comprising a plurality of contacts within at least one of said polygonal loops.

3. The MOSFET structure of claim 1, further comprising a plurality of contacts within each of said polygonal loops.

4. The MOSFET structure of claim 1, wherein said poly-gate element, in association with inherent RC delays, causes suppression of noise signals when said MOSFET is used as a high current-drive output buffer.

5. The MOSFET structure of claim 1, wherein said poly-gate element has rounded corners in said active region to prevent an electric field crowding effect.

6. The MOSFET structure of claim 1, wherein said poly-gate element has a single end.

7. The MOSFET structure of claim 1, wherein said poly-gate element is dual-ended, having an input end and a floating end.

8. The MOSFET structure of claim 1, wherein said poly-gate element provides a total gate-to-area ratio within said active region which is greater than that of a multi—gate-finger type of poly-gate element within an equal size active region.

9. The MOSFET structure of claim 1, wherein said poly-gate element is electrically coupled to a first power bus.

10. The MOSFET structure of claim 9, wherein said first doped regions are electrically coupled to an input node, and said second doped region is electrically coupled to said first power bus.

11. The MOSFET structure of claim 9, wherein said first doped regions are electrically coupled to a second power bus, and said second doped region is electrically coupled to said first power bus.

12. The MOSFET structure of claim 1, wherein said poly-gate element is configured to receive a gate-drive signal.

13. The MOSFET structure of claim 12, wherein said first doped regions are electrically coupled to an output node.

14. An ESD protection structure for enhancing uniform ESD current distribution during an ESD event, comprising:

an active region within a substrate, a plurality of first doped regions of a first impurity type and at least a second doped region of the first impurity type within said active region, said first doped regions and said second doped region being spaced apart by a continuous separation region, said separation region comprising a plurality of interconnected loops inter-positioned between said plurality of first doped regions and said second doped region, such that a continuous separation-region-to-second-doped-region edge is formed along an entire outer edge of said separation region, said separation region being completely disposed within said active region.

15. The ESD protection structure of claim 14, wherein said plurality of loops being a plurality of polygonal loops.

16. The ESD protection structure of claim 14, further comprising a plurality of contacts within each of said loops.

17. The ESD protection structure of claim 14, wherein said separation region has rounded corners in said active region to prevent an electric field crowding effect.

18. The ESD protection structure of claim 14, wherein said first doped regions are electrically coupled to an input node, and said second doped region is electrically coupled to a first power bus.

19. The ESD protection structure of claim 14, wherein said first doped regions are electrically coupled to a second power bus, and said second doped region is electrically coupled to said first power bus.

20. The ESD protection structure of claim 14, wherein said separation region is of a second impurity type.

21. The ESD protection structure of claim 20, wherein:

said second impurity type is opposite to said first impurity type, and said separation region being under an oxide layer.

22. The ESD protection structure of claim 14, wherein:

said plurality of loops comprises at least a plurality of closed loops, and said plurality of first doped regions comprises a plurality of isolated regions being individually surrounded by inner edges of said plurality of closed loops.

23. The ESD protection structure of claim 14, wherein said plurality of loops comprises at least one open loop.

24. The ESD protection structure of claim 20, wherein said plurality of loops comprises a plurality of open loops.

25. The ESD protection structure of claim 23, wherein a continuous separation-region-to-first-doped-region edge is formed along an entire inner edge of said separation region.

26. The ESD protection structure of claim 23, wherein said separation region further comprises first and second portions substantially in parallel to each other.

27. The ESD protection structure of claim 26 wherein said first and second portions being separated by a first distance smaller than a second distance between opposite inner side s of said at least one open loop.

* * * * *